United States Patent [19]

Smith

[11] Patent Number: 4,713,315
[45] Date of Patent: Dec. 15, 1987

[54] WIRE TAG ETCHING SYSTEM

[76] Inventor: David V. Smith, 14014 NE. Salmon Creek Ave., Vancouver, Wash. 98686

[21] Appl. No.: 939,909

[22] Filed: Dec. 9, 1986

[51] Int. Cl.$^4$ ............................................. G03F 7/16
[52] U.S. Cl. .................................. 430/326; 430/320; 430/323; 430/324; 156/645; 156/659.1; 119/3
[58] Field of Search ............... 430/320, 323, 324, 325, 430/326, 945; 156/645, 658, 659.1, 664; 119/3

[56] References Cited

U.S. PATENT DOCUMENTS

| | | |
|---|---|---|
| 2,121,787 | 6/1938 | Dahlgren . |
| 3,313,301 | 4/1967 | Jefferts et al. . |
| 3,369,525 | 2/1968 | Debrotnic et al. . |
| 3,536,545 | 10/1970 | Traynor et al. ................. 156/659.1 |
| 3,545,405 | 12/1970 | Jefferts ................................ 119/3 |
| 3,820,545 | 6/1974 | Jefferts ................................ 119/3 |
| 4,056,395 | 11/1977 | Sato et al. ............................ 430/5 |
| 4,233,964 | 11/1980 | Jefferts et al. ....................... 119/3 |
| 4,293,624 | 10/1981 | Buckley .............................. 430/5 |
| 4,377,627 | 3/1983 | Vinton ................................ 430/5 |
| 4,522,862 | 6/1985 | Bayer et al. .......................... 430/7 |

Primary Examiner—John E. Kittle
Assistant Examiner—Terry J. Owens
Attorney, Agent, or Firm—Kolisch, Hartwell & Dickinson

[57] ABSTRACT

A method of etching a plurality of identifying characters into a wire tag for macro-organisms is disclosed. The method includes the steps of coating the tag with photoresist, exposing a defined portion of the coated tag to light, the defined portion corresponding to the characters, removing a portion of the photoresist, with that removed portion also corresponding to the characters, and etching the uncoated portion of the tag. Thus, a pattern will be etched into the tag which corresponds to the characters. This provides a means for rapidly, inexpensively, and indelibly marking wire tags in a manner which is superior to the methods proposed in the prior art.

12 Claims, 6 Drawing Figures

WIRE TAG ETCHING SYSTEM

BACKGROUND OF THE INVENTION

This invention relates generally to systems for marking macro-organisms, and more particularly to a method for marking macro-organisms such as fish through the use of metallic tags having identifying characters thereon.

For many years, biologists have been attempting to track the migration patterns of animals. Particular emphasis has been placed upon studying the migratory habits of fish. There are several reasons for this, but perhaps the most important reason is because of the susceptibility of fish to environmental damage and to over-fishing. In recent years, the increasing use of hatcheries for propagating, growing and subsequently releasing migratory fish, such as salmon, has led to a strong emphasis upon developing an appropriate method for marking such fish. Because the fish are at the fingerling size when released from hatcheries, there has been a real problem with developing a system for indelibly marking such fish without harming them.

A system has been developed whereby a minute piece of wire, commonly called a tag, is inserted into the cartilaginous region of the nose of the fish. The wire tag is typically magnetized so that when the fish return to spawn, biologists can sort out those fish which have been tagged. The tags are indelibly marked so that the time and place of release can be determined.

One method for indelibly marking a wire tag is disclosed in U.S. Pat. No. 3,545,405 to Jefferts. This patent teaches a system of marking the wire with a plurality of spots in a predetermined pattern. That pattern is typically in binary form, which will enable the biologists to identify the tag and thereby determine the movements of the host fish.

The spots are applied to Jefferts' tag by directing an electrical discharge onto the surface of the wire, thereby burning a pin-point portion of the wire. A pattern of such spots is applied circumferentially around the wire and along its length. Upon subsequent retrieval of the tag, a trained biologist can read the code and determine the migratory pattern of the host fish.

While Jefferts' system provides a means for indelibly marking the tag, the marking operation is cumbersome and requires complex, expensive equipment which must either act upon various regions of the circumferences of the tag simultaneously, or must involve precise rotation of the wire as the marking operation takes place. Another drawback with Jefferts' marking system is that the pattern of circumferentially and axially spaced spots is only readable by a highly trained person, or requires the use of complex and expensive automated deciphering equipment. Another attempt at developing a coding system is disclosed in U.S. Pat. No. 4,233,964, to Jefferts et al., but this system also fails to overcome the drawbacks set forth above.

Yet another problem with prior systems is that in the process of injecting the wire tag into the fish, the tag typically passes through a needle-like device. While the interior surfaces of the needle are relatively smooth, they still may result in the identifying markings being marred or even partially obliterated. This problem has not yet been adequately addressed.

It is therefore an object of the invention to overcome the drawbacks and limitations of the prior art proposals. More specifically, the invention has as its objects:

(1) to provide a method for indelibly and clearly etching macro-organism tracing tags;

(2) to provide a system for marking tags which is suitable for highly automated, high speed marking;

(3) to develop a tagging system which does not require the use of wire tags;

(4) to provide a tagging system which includes a flattened face for easier marking and reading, and for reducing damage to the markings during injection into the macro-organisms; and (5) to develop a tag marking system which can import a wide variety of characters to the tags; and (6) to achieve the above objects while providing a system which is inexpensive, does not require a substantial amount of complex equipment, and does not involve a great deal of expertise on the part of the operator marking or reading the tag;

SUMMARY OF THE INVENTION

The present invention achieves the above objects by providing a method of etching a plurality of identifying characters into a tag, which includes the steps of coating the tag with photoresist, exposing a defined portion of the coated tag to light, removing a portion of the photoresist, the removed portion corresponding to the characters, and etching the uncoated portion of the tag. Thus, a pattern is etched which corresponds to the characters.

The step of exposing the defined portion normally includes directing a highly focused light beam toward the tag. Alternatively, the exposing step may involve positioning a mask defining the characters over the tag, and then exposing the unmasked portion to columnated light.

Another aspect of the invention is a method for etching a plurality of characters into wire for subsequent use on a plurality of identifying tags. This aspect of the invention involves coating the wire with photoresist, positioning a portion of the wire adjacent a masking station, positioning a mask defining at least some of the characters over the wire at the masking station, exposing an unmasked part of the wire to light, removing the mask, advancing the wire so that the next portion is adjacent the masking station, positioning another segment of the wire within the masking station, repeating the two positioning steps and the steps of exposing, removing and advancing, and etching the uncoated portion of the wire so that a pattern is etched which corresponds to the characters for the desired length of wire.

These and other objects, features and advantages of the present invention will become apparent as this description continues.

DETAILED DESCRIPTION OF THE PREFERRED EMBODIMENTS

PREFERRED EMBODIMENT OF FIGS. 1-3

Figure 1:
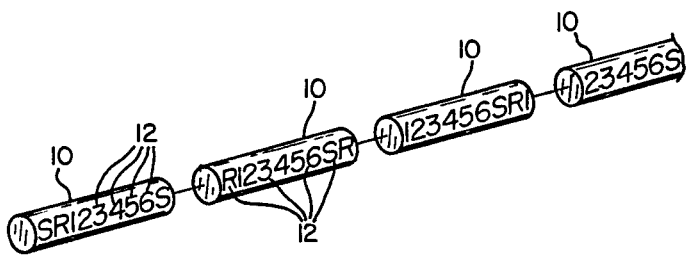
FIG. 1 is a schematic, perspective view of a plurality of wire tags which have been etched using a first preferred embodiment of the present invention.
Figure 2:
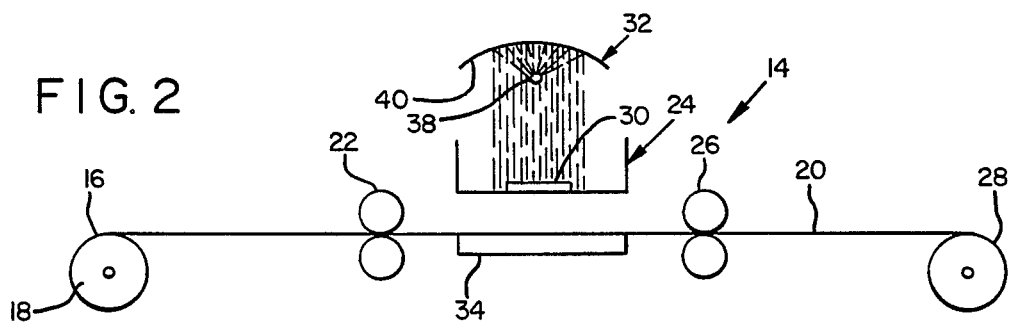
FIG. 2 is a schematic side elevation view of a system using the first preferred embodiment of the invention, and which is designed to advance coated wire through a masking station.
Figure 3:
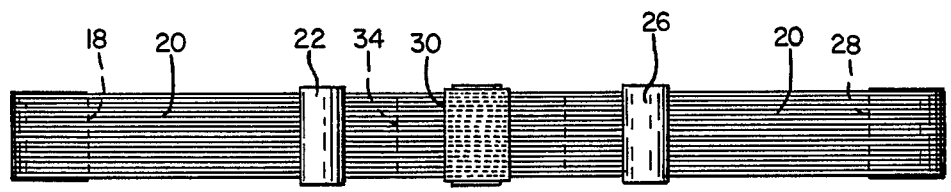
FIG. 3 is a schematic, partially broken-away plan view of the system of FIG. 2, except that the means for exposing the wire has been deleted.

FIGS. 1-3 depict a first preferred embodiment of the present invention. FIG. 1 shows a plurality of wire tags 10, each of which has been indelibly marked with a series of number characters 1 through 6, the characters within that series being collectively identified with the numeral 12. Letter characters, such as SR, may also be marked on tags 10, as may any identifying graphics, all of which are intended to be within the definition of "characters" as that term is used herein. The marked tags 10 are readable by personnel without requiring complex equipment other than magnifying means, do not wear off regardless of how long they remain in a fish, and which are, by the methods of this invention, easily applied to the wire.

The wire from which tags 10 are fabricated is normally approximately 0.01 inches in diameter and is typically cold drawn 302 alloy stainless steel. This material will magnetize, will retain a sufficient amount of that magnetization over an extended period of time, and will remain inert within the fish or other macro-organism in which it is used.

The first step in the process of marking the wire is to coat the wire with photoresist. It is presently preferred that positive photoresist be utilized, and it has been found that AZ 1318-SFO photoresist, marketed by Hoechst Co., is suitable. The thickness of the coating is typically between 2 and 5 μm. Alternatively, as will be discussed below, negative photoresist may be utilized. As with all photoresists, the photoresist described in this embodiment will be sensitive to light and resistant to etchant.

The photoresist is normally applied to the wire by drawing the wire through a reservoir of photoresist, then passing that wire through one or more heaters where the photoresist is hardened prior to respooling the wire. The heaters are not absolutely necessary, but will hasten the drying process. Once the photoresist has dried, it is respooled and is mounted to the masking apparatus. During the photoresist immersion and drying operation, the wire is wrapped around a spool which coaxially mounts a plurality of wires in a parallel fashion.

The masking apparatus, indicated generally at 14, includes a supply spool 16 which mounts a plurality of parallel-extending wires in close proximity. This supply spool 16 is mounted to a supply clutch 18. The wires, indicated at 20, extend from supply spool 16 and are threaded between a first pair of drive spools 22, across a masking station 24, then between a second pair of drive spools 26, before being respooled onto a take-up spool and clutch 28. In each case the upper drive spool 22 or 26 is typically formed of hard rubber, while the lower drive spool 22 or 26 is steel with multiple grooves to keep the wires in alignment. Supply clutch 18, drive rollers 22 and 26, and take-up spool and clutch 28 cooperate to ensure that wires 10 will always be in sufficient tension across masking station 24.

At masking station 24 a shadow mask 30 is used in cooperation with an ultraviolet light source, such as that shown at 32, to expose certain portions of the photoresist-covered wires to ultraviolet light. The ultraviolet light source 32 typically comprises a mercury vapor or similar lamp 38 with a parabolic reflector 40 which cause the light rays to be substantially columnated or directed toward mask 30 along substantially parallel paths. This maximizes the clarity of the edges of the characters exposed in the photoresist.

Mask 30 may be fabricated of film, copper or other material which is opaque to UV rays. When a positive photoresist is used, mask 30 includes etched out portions which correspond to the character 12 which are desired to be imparted in tags 10. Thus, UV light is permitted to pass through those etched out portions of mask 30 and expose the pattern of photoresist which conforms to such characters. As shown in FIG. 3, masking station 24 is designed to receive the parallel-extending wires 20 such that they are in lateral abutment. Mask 30 includes as many lines of characters as there are wires 20. The mask normally also includes more than one series of characters so that wire for several tags 10 can be simultaneously exposed.

Masking station 24 includes a wire mounting platen 34. The masking station can be precisely positioned along the direction perpendicular to the path of travel of wires 20 so that the mask can be precisely positioned with respect to the wires. Such means preferably includes a conventional micrometer adjustment, which has not been depicted. The depicted masking station 24 is shown to be spaced substantially away from the wires. The station typically can be moved up and down, toward and away from the wires, and it will be positioned closely to the wires during the lithographic operation.

Take-up spool and clutch 28 and drive rollers 22 and 26 incrementally feed the length of wires 20 through masking station 24, where each portion of the wires to which characters are to be applied is masked and exposed. Once the desired length of the wires has been masked and exposed, the wires are spooled into the take-up spool and clutch 28.

Wires 20 are then passed through a developer. One such developer is a low-concentration sodium-containing solution, such as that marketed by Hoechst Co. under its AZ 327 MIF designation. This removes the positive photoresist which has previously been exposed to light. The wires may then be passed through a fixing station which hardens the remaining resists, although this is an optional step.

The wires then pass through an etchant where the exposed stainless steel is etched. This is typically liquid etchant, such as diluted ferric chloride. The ferric chloride bath may be performed in a tank having a serpentine path of wire travel, with means for agitating the fluid in the tank. The ferr chloride typically has a BAUME' rating of between 36° and 42°. During etching, a cathode of six volts may be positioned in the bath, so that the wire can serve as an anode. This would speed up the etching process.

After the wire has been etched, the remaining portion of the photoresist is removed by passing the wire through a methylene chloride bath. Alternatively, an alkaline bath can be used. The wire can then be cut into individual tags and be inserted into the fish or other macro-organism by conventional means.

PREFERRED EMBODIMENT OF FIGS. 4-6

Figure 4:
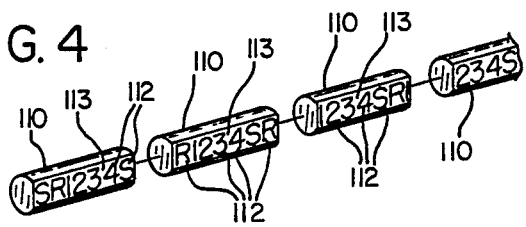
FIG. 4 is a schematic, perspective view of a plurality of wire tags which have been etched using a second preferred embodiment of the present invention.
Figure 5:
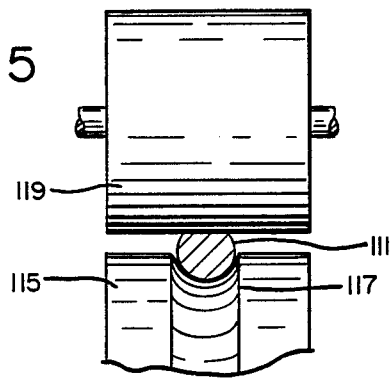
FIG. 5 is an end elevation, partially sectional view of roller means for flattening a side of the wire.
Figure 6:
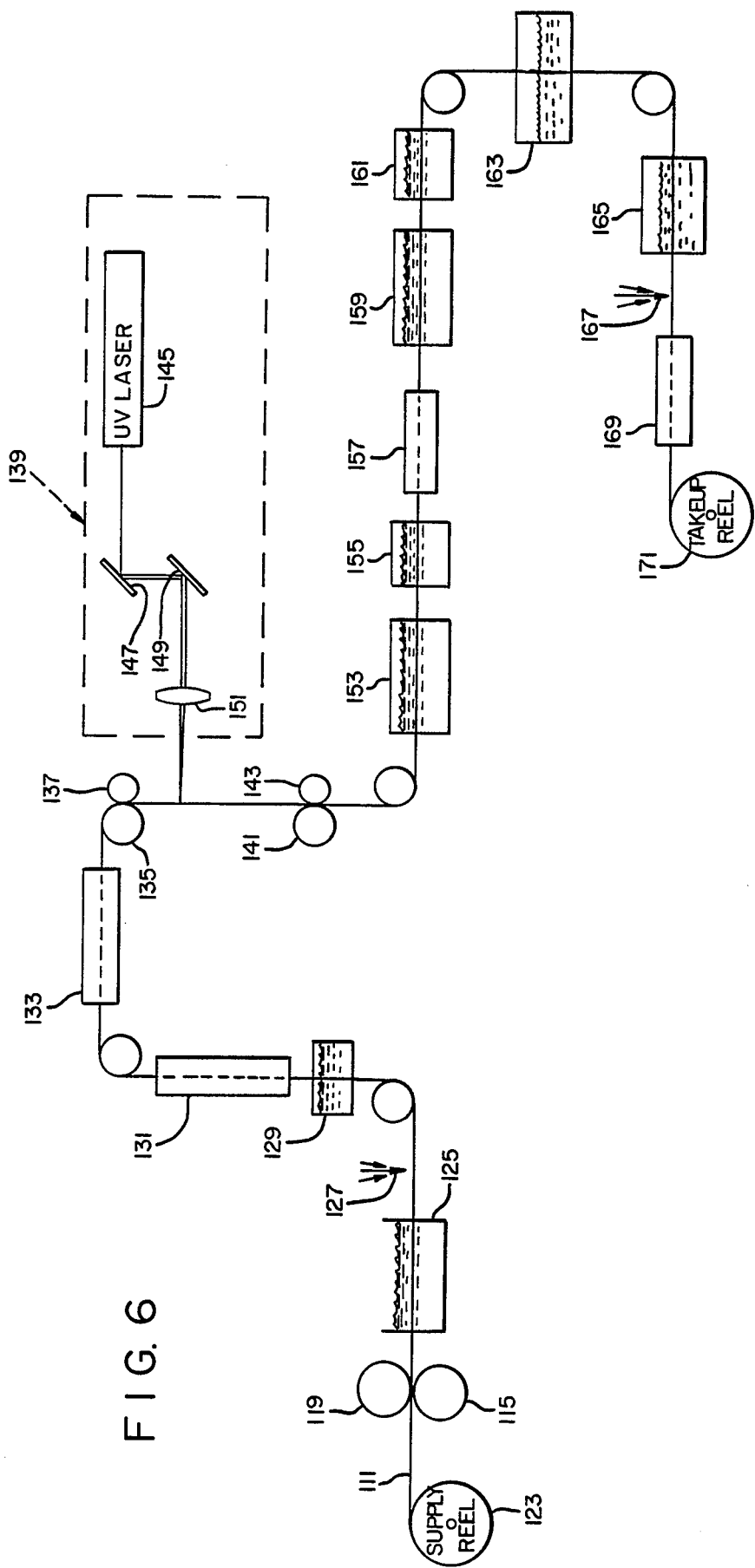
FIG. 6 is a schematic side elevation view of a system using the second preferred embodiment.

Reference should now be made to FIGS. 4-6 in which another preferred embodiment of the present invention is described. This embodiment actually now comprises the presently preferred mode of practicing the invention.

FIG. 4 depicts a plurality of tags 110 which are fabricated in accordance with this second embodiment of the invention. Each of these tags 110 includes a flattened surface 113 on which identifying characters 112 are to be applied. The purpose of the flattened portion 113 will become apparent as this description continues. In other respects, tags 110 are similar to tags 10 and the wire from which they are made.

FIG. 5 depicts the mechanism by which the flattened portion 113 is formed in wire tags 110. The wire from which tags 110 are fabricated is indicated at 111, and is positioned between a pair of hardened, D-2 heat-treated tool steel rollers. Lower roller 115 includes a U-shaped groove 117 in which the wire 111 is positioned. Upper roller 119 imposes a sufficient amount of downward pressure that the stainless steel wire 111 is deformed, and flat surface 113 is created thereon.

Rollers 115 and 119 are shown in FIG. 6 to be disposed immediately downstream of a supply spool 123. After withdrawing wire 111 from supply spool 123, and imposing a flattened surface thereon, rollers 115 and 119 pass the wire through a reservoir 125 containing Carborundum #1 fine buffing powder, where it is subjected to ultrasonic agitation. Wire 111 is then passed through a rinsing jet 127 of water, and then through a reservoir 129 of photoresist, such as that described above. The wire 111 is then directed through a pair of heaters 131 and 133 where the photoresist is dried. The wire then passes through a pair of rollers 135 and 137 which are similar in configuration to rollers 115 and 119, respectively. Thus, roller 135 includes a V-shaped groove (not shown) which permits the wire 111 to be positioned with its flattened portion 113 facing upwardly in abutment with roller 137 so that the wire is properly positioned as it enters UV laser station 139. Immediately downstream of station 139 are another pair of rollers 141 and 143 which are normally identical to rollers 135 and 137, respectively, to further assure the proper positioning of wire 111.

A UV laser is indicated generally at 145 and is of conventional design. Typically, it is low power, such as approximately 50 milliwatts. One suitable UV laser is marketed by Laser Identification Systems, Inc., of Camarillo, Calif., under the LightWriter PC designation. Another suitable laser system is marketed by Electro Scientific Industries of Portland, Oreg. Also included in laser station 139 is a pair of computer controlled mirrors 147 and 149 which precisely position the UV light. These mirrors are also conventional, and are typically included in the laser systems identified above. In combination with a lens 151, mirrors permit the beam of UV light to be precisely controlled so that the light which is imposed on wire 111 will correspond to the identifying characters 112 which are ultimately desired to appear in the wire. The flattened configuration of wire 111 permits these characters to be more precisely etched, thereby facilitating greater readability.

Because positive resist has been used, the portions of photoresist which have been subjected to UV light will, in a reservoir 153 of developer positioned downstream of laser station 139, dissolve, thereby leaving a pattern which corresponds to the desired identifying characters 112. Wire 111 then typically passes through a so-called water rinsing reservoir 155 and a heater 157 where the wire is dried. Wire 111 is then directed through a reservoir 159 of etchant, where the parts of the wire which are not protected by photoresist will be etched. This is where the identifying indicia 112 are actually formed in the wire. A reservoir 161 of rinse water is provided immediately downstream of etchant reservoir 159 to remove any remaining etchant.

An optional feature of this embodiment is a gold plating bath 163 which may be included to deposit gold in the etched-out areas of wire 111. This provides additional contrast and can make the characters easier to read.

Finally, the wire is directed through an acetone rinse reservoir 165, where the remaining photoresist is removed. A water rinse 167 and heater 169 are then typically provided to rinse and then dry and sterilize the wire before it is respooled on a take-up reel 171.

After the wire has been etched, the wire is cut into individual tags using conventional technology as described above, and is injected into the fish. During this injection process, the likelihood of the characters being marred is lessened due to the flattened configuration of the tags.

Modifications of the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

It is claimed and desired to secure by Letters Patent:

1. A method of indelibly etching a plurality of identifying characters into a wire tag for macro-organisms, comprising:
   coating the tag with photoresist;
   exposing a defined portion of the coated tag to light, the defined portion corresponding to the characters;
   removing the defined portion of the photoresist; and
   etching the uncoated portion of the tag, whereby a pattern is etched which corresponds to the characters.

2. The method of claim 1, wherein said step of exposing a defined portion to light comprises directing a highly focused light beam toward the tag.

3. The method of claim 1, wherein the step of exposing a defined portion to light includes positioning a mask defining the characters over the tag, and then exposing the unmasked portion of the tag to light.

4. The method of claim 1, further comprising selecting a tag having an annular cross section and creating a flattened side on the tag prior to said exposing step.

5. The method of claim 1, further comprising at least partially filling the etched-out portions of the tag with a visually-contrasting material.

6. The method of claim 5, wherein the etched-out portions are at least partially filled with gold.

7. A method of etching a plurality of characters into wire for subsequent use as a plurality of identifying tags for macro-organisms, comprising:
   coating the wire with photoresist;
   positioning a portion of the wire adjacent a masking station;

positioning a mask defining at least some of the characters over the portion of the wire;

exposing an unmasked part of the tag to light at the masking station;

removing the mask;

advancing the wire so that a next portion is adjacent the masking station;

repeating the positioning, exposing, removing and advancing steps as necessary to expose desired portions of the wire; and etching the uncoated portion of the wire, whereby a pattern is etched along the length of the wire which corresponds to the characters.

8. The method of claim 7, wherein said coating step comprises coating the wire with positive photoresist, said exposing steps comprise depolymerizing the unmasked photoresist, and said removal step comprises removal of the unmasked positive photoresist.

9. The method of claim 7, wherein said steps of removing a portion of the photoresist and etching the uncoated portion of the wire by applying an appropriate solution.

10. A method of etching a plurality of identifying characters into a wire tag for macro-organisms, comprising:

coating the tag with photoresist;

positioning a mask defining the characters over the tag;

exposing an unmasked portion of the tag to light;

removing a portion of the photoresist, said removed portion corresponding to the characters; and etching the uncoated portion of the tag, whereby a pattern is etched which corresponds to the characters.

11. The method of claim 10, wherein said coating step comprises coating the tag with a positive photoresist, said exposing step comprises depolymerizing the unmasked photoresist, and said removal step comprises removal of the unmasked positive photoresist.

12. The method of claim 10, wherein said coating step comprises coating the tag with a negative photoresist, said exposing step comprises polymerizing the unmasked photoresist, and said removal step comprises removal of the nonexposed negative photoresist.

* * * * *